United States Patent [19]

Busacco et al.

[11] Patent Number: 5,248,262

[45] Date of Patent: Sep. 28, 1993

[54] HIGH DENSITY CONNECTOR

[75] Inventors: Raymond A. Busacco, Lake Ariel, Pa.; Chi S. Chang, Endicott, N.Y.; Fletcher W. Chapin, Vestal, N.Y.; David W. Dranchak, Endwell, N.Y.; Thomas G. Macek; James R. Petrozello, both of Endicott, N.Y.; George J. Saxenmeyer, Jr., Apalachin, N.Y.; Rod A. Smith, Vestal, N.Y.

[73] Assignee: International Business Machines Corporation, Armonk, N.Y.

[21] Appl. No.: 901,055

[22] Filed: Jun. 19, 1992

[51] Int. Cl.$^5$ ............................................. H01R 9/09
[52] U.S. Cl. ...................................... 439/66; 439/67; 439/77; 439/493; 439/591
[58] Field of Search ................... 439/66, 67, 77, 492, 439/493, 495, 499, 591

[56] References Cited

U.S. PATENT DOCUMENTS

| | | |
|---|---|---|
| 3,679,940 | 7/1972 | Newman et al. . |
| 3,941,442 | 10/1976 | Friend . |
| 3,960,423 | 6/1976 | Weisenburger . |
| 3,960,424 | 6/1976 | Weisenburger . |
| 4,027,935 | 6/1977 | Byrnes et al. . |
| 4,295,700 | 10/1981 | Sado . |
| 4,505,529 | 10/1985 | Barkus . |
| 4,634,199 | 1/1987 | Anhalt et al. . |
| 4,636,018 | 1/1987 | Stillie . |
| 4,655,519 | 4/1987 | Evans et al. . |
| 4,764,848 | 8/1988 | Simpson . |
| 4,793,814 | 12/1988 | Zifcak et al. . |
| 4,818,634 | 4/1989 | Bliss . |
| 4,824,391 | 4/1989 | Ii . |
| 4,875,863 | 10/1989 | Reed . |
| 4,943,242 | 7/1990 | Frankeny et al. . |
| 4,998,885 | 3/1991 | Beaman . |
| 4,998,886 | 3/1991 | Werner . |
| 5,037,311 | 8/1991 | Frankeny et al. . |
| 5,049,084 | 9/1991 | Bakke . |
| 5,061,192 | 10/1991 | Chapin et al. . |
| 5,102,343 | 4/1992 | Knight et al. ........................ 439/66 |
| 5,123,849 | 6/1992 | Deak et al. ........................... 439/66 |

FOREIGN PATENT DOCUMENTS 1121011 3/1982 Canada .
1568464 5/1980 United Kingdom .

OTHER PUBLICATIONS

Research Disclosure, Jan. 1990, No. 309 (30964), "Dendrite Connectors For Low Temperature System Packaging".

Research Disclosure, Apr. 1991, No. 324 (32470), "Height Adjustable Disconnectable Electrical Mini Links".

Primary Examiner—Paula A. Bradley
Attorney, Agent, or Firm—Lawrence R. Fraley

[57] ABSTRACT

An electrical connector for interconnecting a pair of circuit members (e.g., a circuit board and module), which, in one embodiment, includes a housing, at least one flexible circuit within the housing and a spring means attached to the flexible circuit at two spaced locations for exerting force against the flexible circuit to cause the circuit to engage respective conductive pads on the circuit members when the circuit members are moved toward each other (e.g., compressed). The shape of the spring means conforms substantially to the portion of the flexible circuit between the locations of attachment. In another embodiment, a connector for interconnecting such circuit members includes a housing adapted for being located between both members and at least one elongated, compressible contact member in the housing and including conductive end portions for engaging the circuit members. The contact occupies a first, prestressed position before engagement and is adapted for moving to a second, compressed position during the engagement. The conductive end portions of the flexible circuit in the first embodiment and the contact member in the second embodiment preferably comprise a plurality of dendrites for providing enhanced connections.

47 Claims, 11 Drawing Sheets

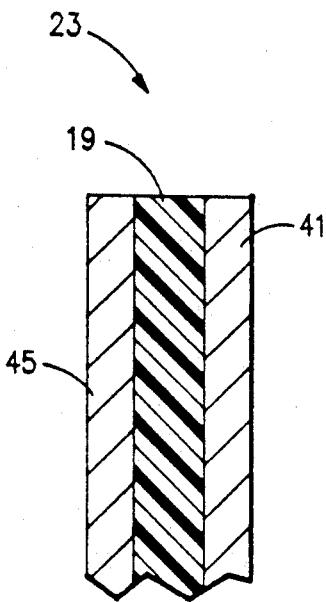
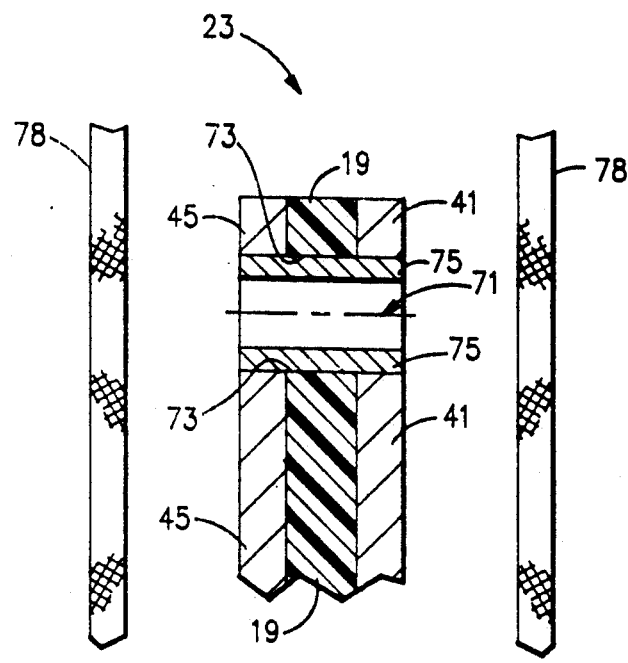
FIG.7
FIG.8
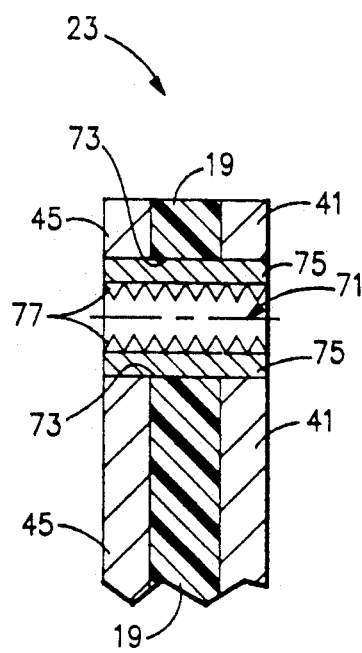
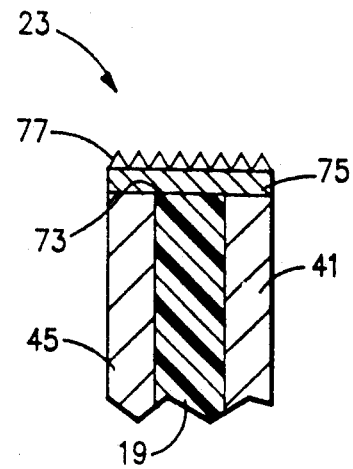
FIG.9
FIG.10

HIGH DENSITY CONNECTOR

TECHNICAL FIELD

The invention relates to the field of electrical connectors and particularly to electrical connectors for interconnecting at least two electrical circuit members such as printed circuit boards, circuit modules or the like. Even more particularly, the invention relates to connectors of this type which may be used in the information handling system (computer) environment.

CROSS-REFERENCE TO CO-PENDING APPLICATION

In Ser. No. 07/901,054, filed Jun. 19, 1992 under Attorney's Docket No. EN992079, and entitled "Method Of Forming A Conductive End Portion On A Flexible Circuit Member" (inventors: R. Busacco, et al.), there is defined a method of providing a plurality of dendritic elements on the ends of flexible circuit members such as may be used in the instant invention.

BACKGROUND OF THE INVENTION

The current trend in connector design for those connectors utilized in the computer field is to provide both high density and high reliability connections between various circuit devices which form important parts of the computer. High reliability for such connections is essential due to potential end product failure, should vital misconnections of these devices occur. Further, to assure effective repair, upgrade, and/or replacement of various components of the system (i.e., connectors, cards, chips, boards, modules, etc.), it is also highly desired that such connections be separable and reconnectable in the field within the final product, as well as tolerant of dust and fibrous debris. Such a capability is also desirable during the manufacturing process for such products, e.g., to facilitate testing.

One prior technique for providing various interconnections is referred to as a wire bond technique, which involves the mechanical and thermal compression of a soft metal wire, e.g., gold, from one circuit to another. Such bonding, however, does not lend itself readily to high density connections because of possible wire breakage and accompanying mechanical difficulty in wire handling. Another technique involves strategic placement of solder balls or the like between respective circuit elements, e.g., pads, and reflowing the solder to effect interconnection. While this technique has proven extremely successful in providing high density interconnections for various structures, this technique does not allow facile separation and subsequent reconnection. In yet another technique, an elastomer has been used which included therein a plurality of conductive paths, e.g., small diameter wires or columns of conductive material, to provide the necessary interconnections. Known techniques using such material typically possess the following deficiencies: (1) high force necessary per contact which can be inherent in a particular design and exacerbated due to non-planarity of the mating surfaces; (2) relatively high electrical resistance through the interconnection between the associated circuit elements, e.g., pads; (3) sensitivity to dust, debris and other environmental elements which could readily adversely affect a sound connection; and (4) limited density, e.g., due to physical limitations of particular connector designs. Such prior art elastomeric structures also typically fail to provide effective wiping connections, which form of connection is highly desirable in many high density interconnection schemes.

Attention is directed to U.S. Pat. Nos. 3,960,423, 3,960,424, 4,295,700, 4,636,018, 4,655,519, 4,793,814 and 5,049,084 for various techniques for providing electrical interconnections for a variety of electrical circuit members. As understood from a reading of these patents, the techniques as described therein include many of the aforedefined disadvantages, e.g., non-repeatability, potential misalignment, low density, etc. as well as others, e.g., relatively complex design, costly to manufacture, etc.

In U.S. Pat. No. 5,061,192, assigned to the same assignee as the present invention, there is defined an electrical connector for interconnecting a pair of circuit members (e.g., circuit, module and printed circuit board) which assures highly reliable, yet separable connections for these members. The connector includes an electrically insulative (e.g., plastic) frame which defines an internal opening therein. Bridging this opening are a plurality of individual, resilient contact members which are maintained in a suspended and spaced orientation within the opening by a plurality of pairs of elongated insulative members (e.g., polymer rods). Each of the contacts is thus removable from the connector's frame to facilitate repair and/or replacement. As described, the connector is capable of providing wiping connections, thus assuring removal of debris or other contaminants from the respective conductive pads for each circuit member. In another embodiment, the connector includes a common carrier (e.g., plastic) having therein a plurality of cylindrical shaped resilient contact members (e.g., silicone) which further include a quantity of conductive (e.g., metallic) particles therein. To assure a wiping form of engagement with the respective conductive pads, each of the terminal ends of each contact member preferably includes a plurality of dendritic, interdigitated members thereon. This patent is incorporated herein by reference.

It is believed that a high density electrical connector capable of providing effective, reliable connections (including providing a wiping type of connection), wherein such connections are repeatable (such that connection and reconnection can readily occur), and which provides the other advantageous features discernible from the following description would constitute a significant advancement in the art. Such a connector, as defined herein, also represents an improvement over the connector in U.S. Pat. No. 5,061,192, e.g., through elimination of the need for retention.

DISCLOSURE OF THE INVENTION

It is, therefore, a primary object of the present invention to enhance the electrical connector art.

It is another object of the invention to provide an electrical connector capable of providing high density interconnections of a highly reliable and improved nature, which connections can be readily separated and repeated if desired.

It is yet another object of the invention to provide such a connector which is relatively inexpensive to manufacture and also of a relatively simplistic design.

In accordance with one aspect of the invention, there is provided a connector for electrically interconnecting first and second electrical circuit members, the connector comprising a housing adapted for being positioned substantially between the first and second electrical circuit members, at least one elongated flexible circuit member located within the housing and including a dielectric layer and at least one conductive element having first and second conductive end portions for engaging the first and second circuit members, respectively, and spring means operatively connected to the flexible circuit member for exerting a predetermined force against the flexible circuit member to cause the first and second conductive end portions of the conductive element to engage the first and second circuit members. The spring means is attached to the flexible circuit member at spaced locations and includes a shape substantially conforming to the portion of the flexible circuit member.

In accordance with another aspect of the invention, there is provided a connector for electrically interconnecting first and second electrical circuit members comprising a housing adapted for being positioned substantially between the first and second electrical circuit members, and at least one elongated, compressible contact member located within the housing and including first and second conductive end portions for engaging the first and second electrical circuit members, respectively. The contact member is adapted for occupying a first position while having a first predetermined shape and being in a prestressed condition within the housing and thereafter occupying a second position while having a second predetermined shape and being in a compressed condition within the housing during the engagement between the first and second conductive end portions and the first and second electrical circuit members, respectively.

BRIEF DESCRIPTION OF THE DRAWINGS

FIGS. 7-10 represent the various steps in providing dendritic conductive elements on the end portions of a flexible circuit member such as may be used in both of the embodiments of FIGS. 4 and 13;

BEST MODE FOR CARRYING OUT THE INVENTION

For a better understanding of the present invention, together with other and further objects, advantages and capabilities thereof, reference is made to the following disclosure and appended claims in connection with the above-described drawings.

Figure 1:
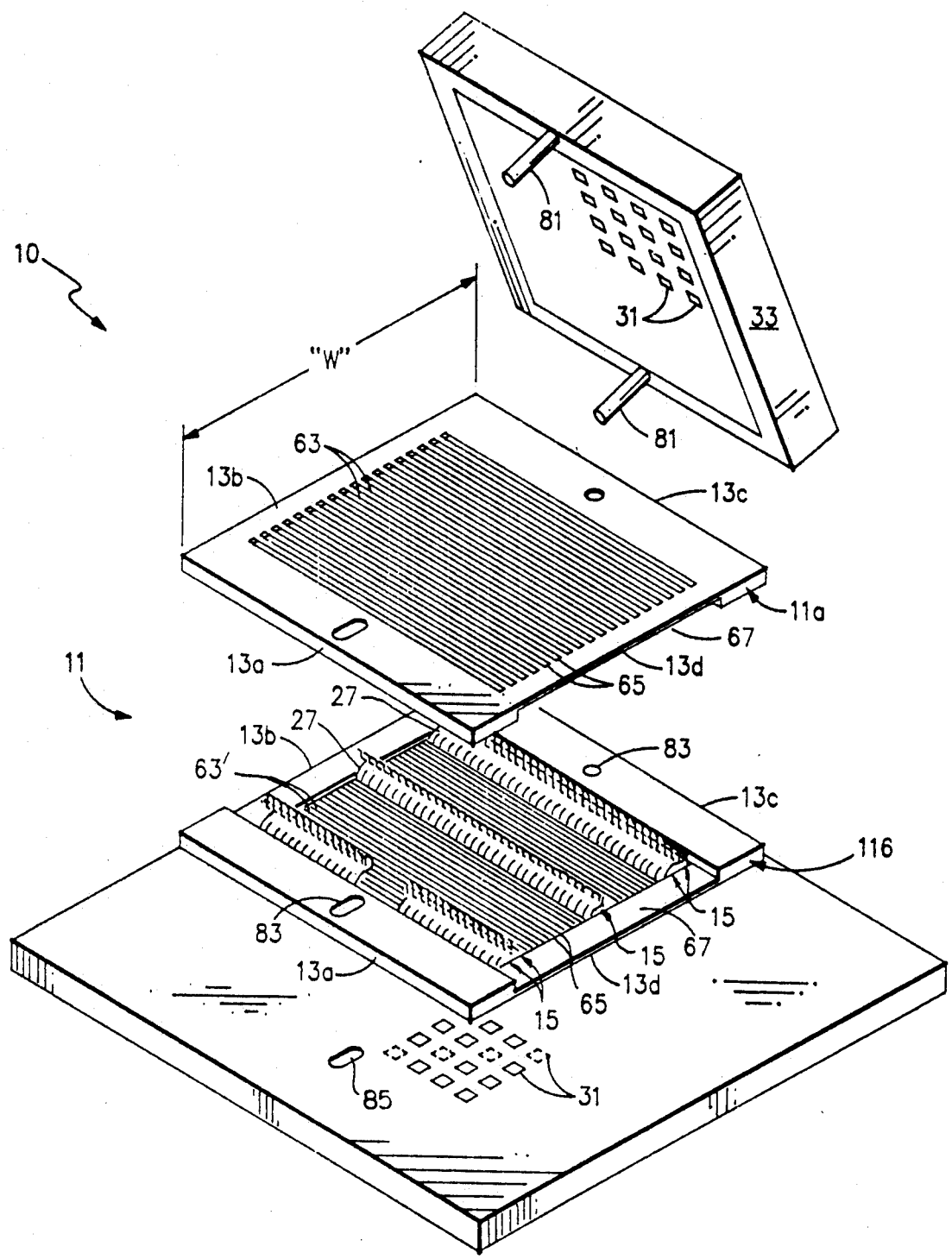
FIG. 1 is an exploded perspective view of a connector according to one aspect of the invention.

In FIG. 1, there is shown a connector 10 in accordance with one embodiment of the invention. Connector 10 comprises a housing 11 including, preferably, two parts 11a and 11b, each part preferably molded and of an electrically insulative, e.g., plastic, material and, as illustrated, preferably of substantially a rectangular configuration having a plurality (e.g., four) of walls 13a, 13b, 13c, 13d. In one example of the invention, housing 11 may possess a width (dimension "W") of about five inches This housing may also possess a combined thickness (dimension "T", FIG. 2) of only about 0.30 inch. As stated, the preferred material for housing 11 is plastic, with suitable examples of such material being Vectra (a trademark of Hoechst Celanese Corporation), Ryton (a trademark of Phillips Petroleum Company), phenolic, and polyester.

Figure 2:
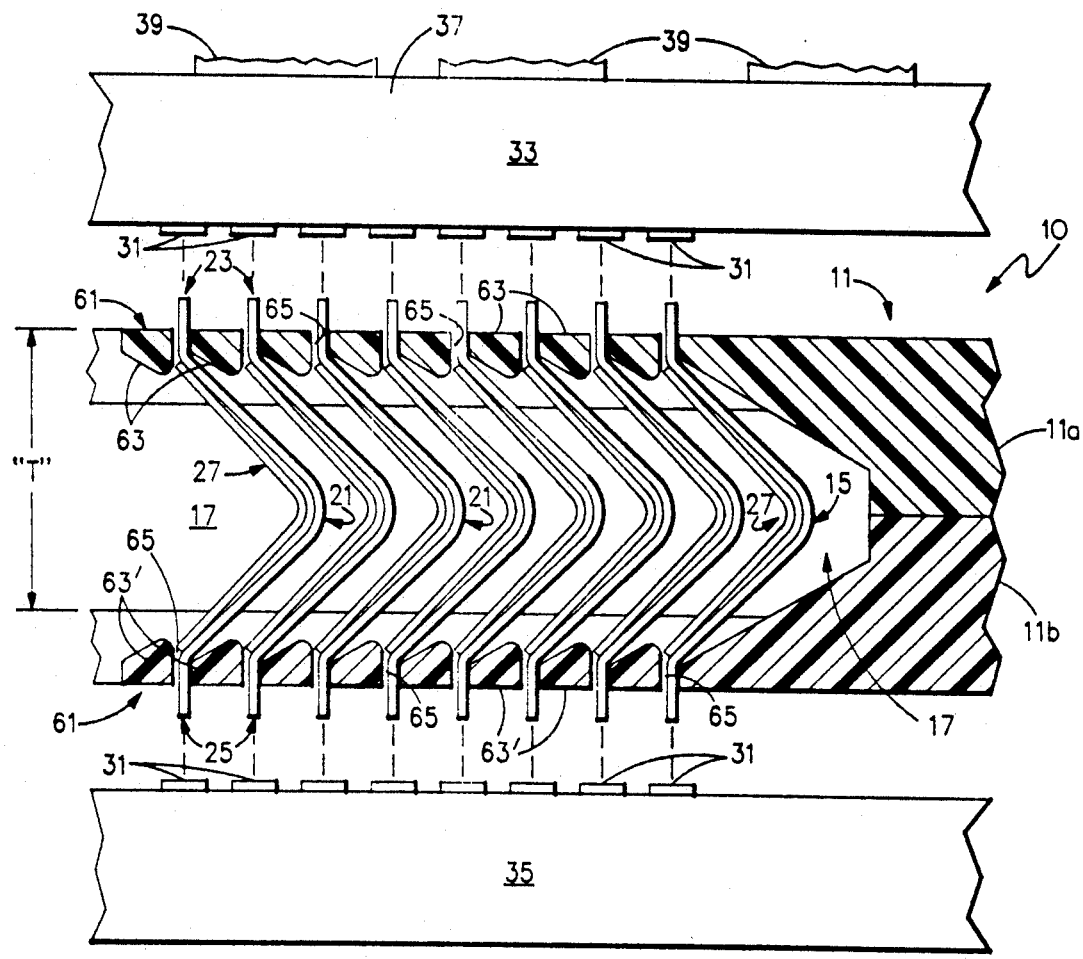
FIG. 2 is a partial side view, in section, of the connector of FIG. 1, on a larger scale, and prior to circuit member engagement.
Figure 3:
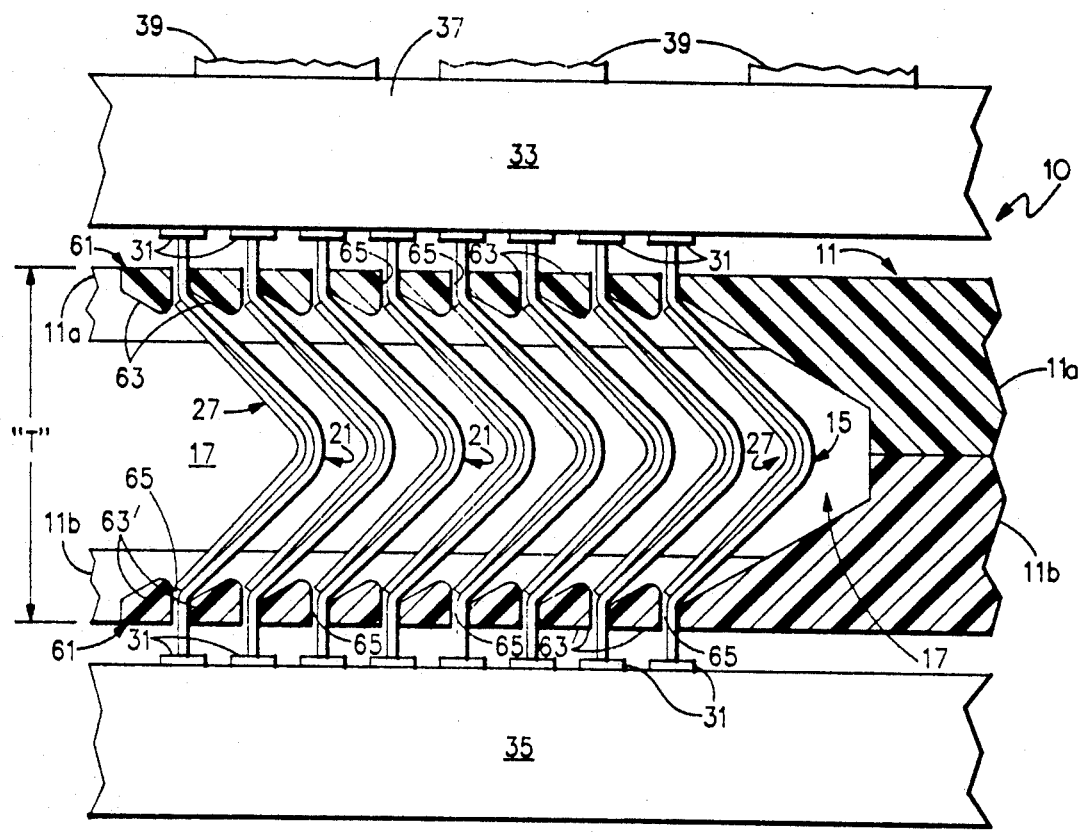
FIG. 3 is a partial side view, in section, of the connector of FIG. 2, during circuit member engagement.

Connector 10, as illustrated in FIGS. 1-3, further includes a plurality of pairs 61 of elongated, electrically insulative members 63 and 63'. Each insulative member 63 and 63' preferably comprises a substantially trapezoidal-shaped rib of polymer material, suitable examples of such material being Vectra, Ryton, phenolic, and polyester, located within one or both of the housing parts 11a and 11b. Alternatively, these ribs may be formed as integral parts thereof (e.g., molded as part of each piece). Such construction may serve to enhance manufacturability. Other configurations, including octagonal, hexagonal, cylindrical, etc. may be used for members 63 and 63'.

Electrically insulative members (ribs) 63 and 63' are specifically designed for holding respective elongated, resilient flexible circuit members 15 (defined in greater detail hereinbelow) in a suspended position between opposing walls 13b and 13d. Specifically, each pair 61 of two such members 63 and 63' is particularly designed for engaging the respective opposing end portions 23 and 25 respectively of each flexible circuit member 15.

More specifically, and as best seen in FIG. 2, each opposing end 23 and 25 of the flexible circuit members 15 is preferably engaged on at least one side thereof. Thee aforedefined first pair 61 engages the ends along a first side (e.g., on the right side of the vertically oriented flexible circuit member 15 in FIG. 2), while a second pair 61 engages the flexible circuit member 15 from the other side (the left in FIG. 2). In FIG. 2, flexible circuit member 15 is shown to include only one conductive element on at least one side of the flexible circuit member's dielectric layer (described below). However, it is understood that the use of multiple conductors on each side of the dielectric layer is well within the scope of this invention, as further shown in FIG. 6, and is, in fact, preferred for use herein.

Additionally, each pair 61 of members 63 and 63' serves to maintain each flexible circuit member 15 in a substantially upright orientation, as depicted in FIG. 2. Therein, each spring means 27 (defined in greater detail hereinbelow) is oriented in an upright manner such that a central curved portion 21 extends in a lateral direction (to the right in FIG. 2). Adjacent pairs of members 63 or 63' define a slot 65 therebetween for having one end of flexible circuit member 15 inserted therein. In effect, two pairs 61 of insulative members (which form a pair of slots 65) serve to guide each flexible circuit member 15 to provide location, both before and during engagement, with conductive pads 31 on circuit members 33 and 35 (also defined in greater detail hereinbelow). Significantly, under normal operating conditions, the opposing ends 23 and 25 exert minimal expansion (outward) force against the polymer ribs regardless of whether connector 10 is in an open (unactuated) or closed (actuated) position. The ends 23 and 25 exert this minimal expansion (outward) force in the unactuated state because flexible circuit member 15 is in a relaxed position and is essentially vertically free floating between the illustrated upper and lower ribs. When connector 10 is in a closed (actuated) position, ends 23 and 25 will still exert minimal expansion (outward) force on the ribs because the upper and lower conductive pads 31 (which engage opposing end portions 23 and 25) lock the location of the ends substantially as shown in FIG. 3 against the pads due to the frictional forces developed between the end portions and pads.

In FIG. 2, connector 10 is shown prior to interconnecting the respective conductive pads 31 on the two circuit members (e.g., a circuit module 33 and printed circuit board 35). In this unactuated arrangement, the upper end portions 23 of each flexible circuit member 15 extend slightly above the upper surface of housing part 11a while the opposing ends 25 extend below the lower, planar surface of the housing part 11b. In one example, each of these end portions may extend a distance of about 0.015 inch beyond the respective planar, outer surfaces of these parts.

In FIG. 3, the opposing circuit members 33 and 35 have been moved relative to each other (e.g., by an external clamping means, not shown but within the abilities of one skilled in the art) so as to compress the flexible circuit members 15 within housing parts 11a and 11b. That is, each of the arrays of conductive elements (41, 43, FIG. 6) for each flexible circuit member 15 engages a respective circuit member to provide electrical interconnection between such pads in the desired manner. Each extending end 23 and 25 is thus compressed such that the terminal end portions thereof lie substantially parallel to, but extend slightly above, the respective adjacent outer surfaces of parts 11a and 11b. Such compression results in slight displacement of the curvilinear central portions 21 of each flexible circuit member to cause further outward (to the right in FIG. 3) bowing thereof. Each flexible circuit member, however, maintains a spaced distance from the respective adjacent flexible circuit member so as not to electrically contact this member and thus possibly become electrically shorted thereto. Further assurance against this can be provided by the utilization of a layer 47 of dielectric material (FIG. 5) on at least one external surface of the flexible circuit member. Significantly, the compression of each flexible circuit member causes the outwardly extending end portions of each flexible circuit member to engage the respective conductive pad 31 in a vertically penetrating manner. This is highly desired in high density connections of the type defined herein, e.g., to penetrate films, remove debris and other contaminants which may affect these points of connection.

The flexible circuit member 15 and spring means 27 are not shown in cross-section in FIGS. 2 and 3 for ease of illustration. Such cross-section is provided in the larger views in FIGS. 4 and 5.

Housing 11, as defined, is adapted for being positioned between the pair of electrical circuit members 33 and 35 to thus form part of connector 10, which understandably serves to interconnect said circuit members. Examples of suitable circuit members for being interconnected by connector 10 include printed circuit boards, circuit modules, etc. By the term printed circuit board is meant to include a multilayered circuit structure including therein one or more conductive (e.g., signal, power and/or ground) layers. Such printed circuit boards, also known as printed wiring boards, are well known in the art and further description is not believed necessary. By the term circuit module is meant to include a substrate or the like member having various electrical components (e.g., semiconductor chips, conductive circuitry, conductive pins, etc.) which may form part thereof. Such modules are mentioned in U.S. Pat. Nos. 4,688,151 and 4,912,772 and further description is thus not believed necessary. The disclosures of these patents are thus incorporated herein by reference.

Connector 10, as stated above, includes at least one (and preferably a plurality) of the described elongated, resilient flexible circuit members 15 positioned within housing parts 11a and 11b. Although five such flexible circuit members are shown in FIG. 1 for illustration purposes (and eight in FIGS. 2-3), it is understood that several additional such flexible circuit members may be used (and are preferably so) as part of the invention. In one embodiment of the connector of the invention, for example, a total of about 140 such members may be used. Each flexible circuit member 15 is located so as to substantially occupy an internal central opening 17 defined by the housing walls 13a-13d. It is understood, as shown in FIG. 1, that these flexible circuit members substantially abut the internal surfaces of opposing walls 13b and 13d. By the term substantially abut is meant slight engagement by each flexible circuit member 15 at one or both opposite ends thereof with a respective, adjacent housing wall. These flexible circuit members 15 are thus arranged in substantially parallel, spaced orientation within central opening 17. Significantly, flexible circuit members 15 do not become located on or inserted within the housing's side walls but, as shown, remain substantially therebetween.

Figure 4:
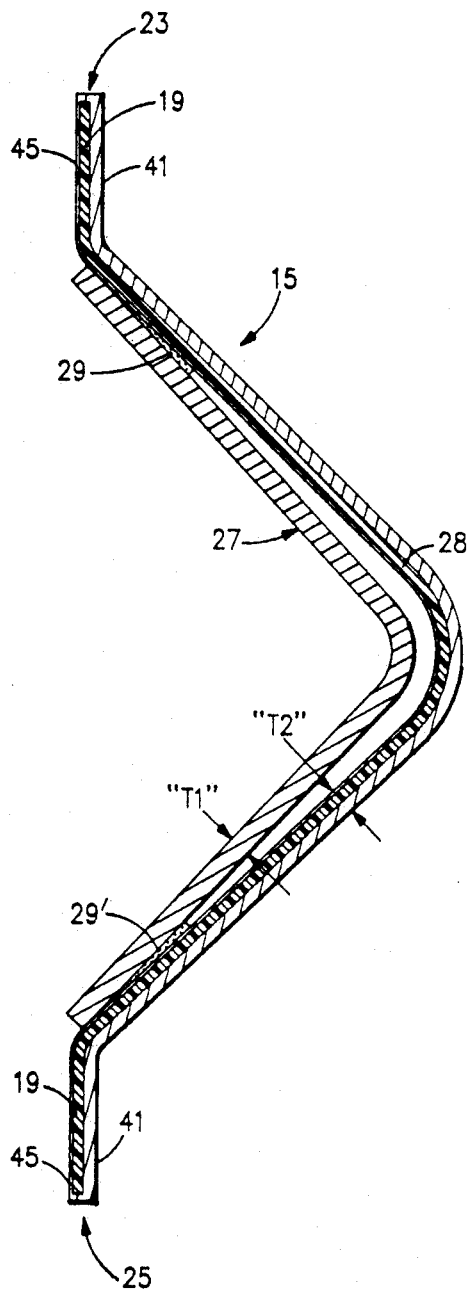
FIG. 4 is a side view, in section, of the elongated flexible circuit member and spring means in accordance with the embodiment of FIG. 1, in a relaxed state prior to actuation thereof.
Figure 5:
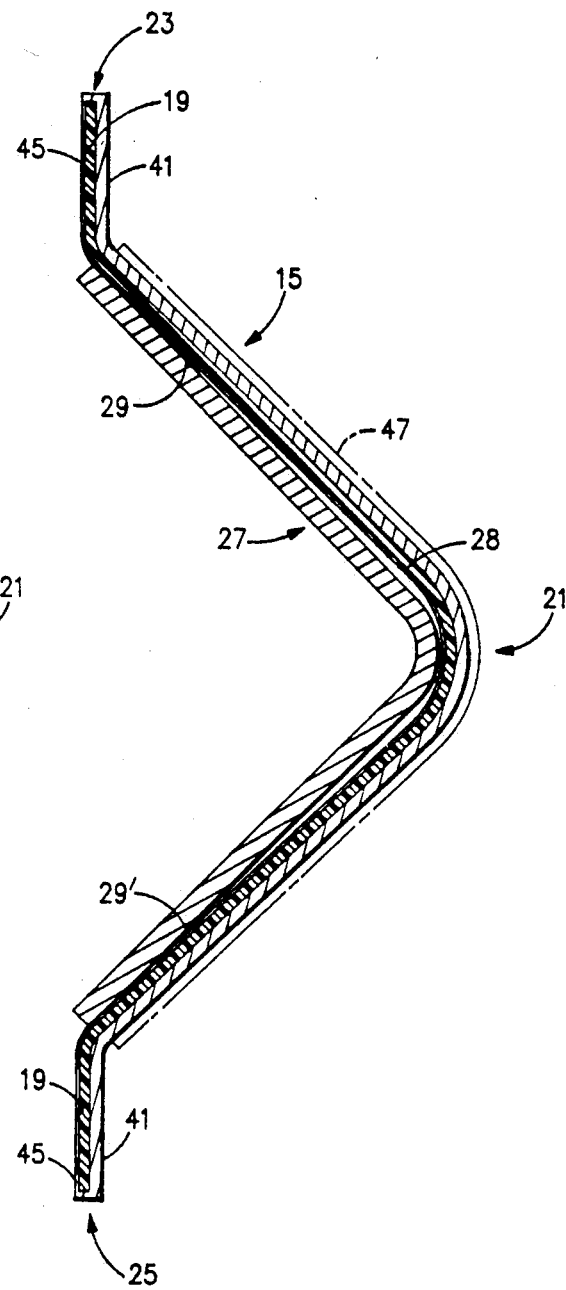
FIG. 5 is a side view, in section, of the member and spring means of FIG. 4, in an actuated position.

A more detailed illustration of each flexible circuit member 15, taken in section, is seen in FIGS. 4-5. Each flexible circuit member 15 includes one or more conductive elements 41, 43 and 45 (FIG. 6), preferably of copper (or similar metallic material including e.g., phosphor bronze, beryllium-copper, etc.) on at least one side of a dielectric (e.g., polyimide) layer 19. Significantly, copper is the preferred material for the conductive elements 41, 43, and 45 because of its relatively low electrical and thermal resistivity compared to other metals commonly used in connectors. Preferably, conductive elements 41, 43 and 45 and end portions 23 and 25 are also plated with corrosion-resistant, sound conducting metallic material such as nickel, gold, silver, palladium, etc.

Conductive elements 45 on the backside of dielectric layer 19 can be selectively commoned electrically to conductive elements 41, 43 on the opposite side of the dielectric layer 19 through end portions 23 and 25 (shown in FIGS. 4–5), although it is understood that alternate means of electrically connecting the two sides (e.g., vias, plated-through-holes, etc.) are possible and thus within the scope of this invention.

As also shown in FIG. 4, each flexible circuit member 15 includes a substantially curved, central portion 21 with the first and second projecting end portions 23 and 25 extending in a substantially opposite manner from this central curved portion. Each opposing end 23 and 25 is designed for electrically contacting respective circuit elements (e.g., flat conductive pads 31) located on the respective surfaces of the circuit members 33, 35 in FIG. 2. As stated, these circuit members may be printed circuit boards (e.g., 35) having such flat conductive members (e.g., copper terminals) located on an outer surface thereof. These circuit members may also comprise the aforedefined circuit module 33 including a substrate 37 having a plurality of semiconductor elements 39 thereon and corresponding flat conductive pads (e.g., thin copper elements) 31 located on a bottom, external surface. The defined conductive pads 31 are, understandably, electrically coupled to corresponding circuitry which forms part of the respective electrical circuit members. These pads may provide signal, power or ground connections, depending on the operational requirements of the respective circuit member.

Further shown in FIG. 4 is the aforementioned spring means 27, preferably of maraging or stainless steel, which is connected to the conductive element 45 on the backside of dielectric layer 19 (or directly to the dielectric layer 19 if conductive elements 45 are not present) in at least two separate locations, preferably near the ends 23 and 25 (e.g., at locations 29 and 29' in this embodiment), by attachment means such as soldering, welding, or use of either conductive or nonconductive adhesive. Such an adhesive is preferred if means 27 is connected directly to dielectric layer 19.

During the process of attaching spring means 27, a space 28 is formed in the curved portion 21 between the spring means 27 and flexible circuit member 15 in order to reduce the maximum stress in the curved portion 21 of the flexible circuit member 15 both during and following actuation of connector 10. More specifically, this space allows spring means 27 and flexible circuit member 15 to deform independently (each with respect to its own neutral axis), thereby reducing the maximum bending stresses in each. In contrast, in a composite member (i.e. one in which spring means 27 and flexible circuit member 15 are laminated together along their entire length and are restrained from sliding with respect to each other at the lamination interface), a single neutral axis is developed such that the maximum distance of a point in the composite from the neutral axis will be greater than in the previous case, thereby increasing the maximum bending stresses in both spring means 27 and flexible circuit member 15. As can be seen in FIG. 5, which shows a single flexible circuit member 15 in its actuated state, the above-mentioned space between the spring means 27 and conductive element 45 is reduced but still preferably present.

The space formed between spring means 27 and flexible circuit member 15 not only reduces the stress in both of these members, but also substantially reduces the combined stiffness as well. This occurs because the stiffness of spring means 27 is proportional to the cube of its thickness. In the case where a space is formed in the curved portion 21 between spring means 27 and flexible circuit member 15, the stiffness will be proportional to the sum of the cubes of the individual thicknesses of spring means 27 and flexible circuit member 15. In the case of a composite member as described above, the stiffness will be proportional to the cube of the sum of the thicknesses of spring means 27 and flexible circuit member 15. Clearly, for any value of thickness ("T1", FIG. 4) for the spring means and thickness ("T2", FIG. 4) for the flexible circuit member, T1 raised to the third power plus T2 raised to the third power will be less than the sum of T1 plus T2 raised to the third power. Therefore, the first combination cited above, which is incorporated in the preferred embodiment of the invention, is less stiff.

Significantly, the use of maraging steel for spring means 27 to provide the vertically outward forces needed to support flexible circuit members (and especially the copper conductive elements thereof), both during and after actuation of connector 10, allows a separation of the mechanical and electrical functions of the flexible circuit member/spring means assembly, which allows optimization of each function both in terms of material and performance.

Additionally, maraging steel is a preferable material for spring means 27 because of its high yield and tensile strengths compared to copper (which, as mentioned, is the preferred material of the conductive elements 41, 43 and 45). The tensile strength of maraging steel is at least twice that of the copper used for conductive elements 41, 43 and 45. Furthermore, the yield strength of maraging steel is at least fifteen times greater than that of the copper conductive elements 41, 43 and 45. For example, according to the December, 1990 issue of "Materials Engineering" magazine (which is hereby incorporated by reference), pages 41 and 82, at room temperature, the yield strength of annealed copper is approximately 10,000 p.s i. while 18 percent nickel maraging steel is approximately 255,000 p.s.i.

Figure 6:
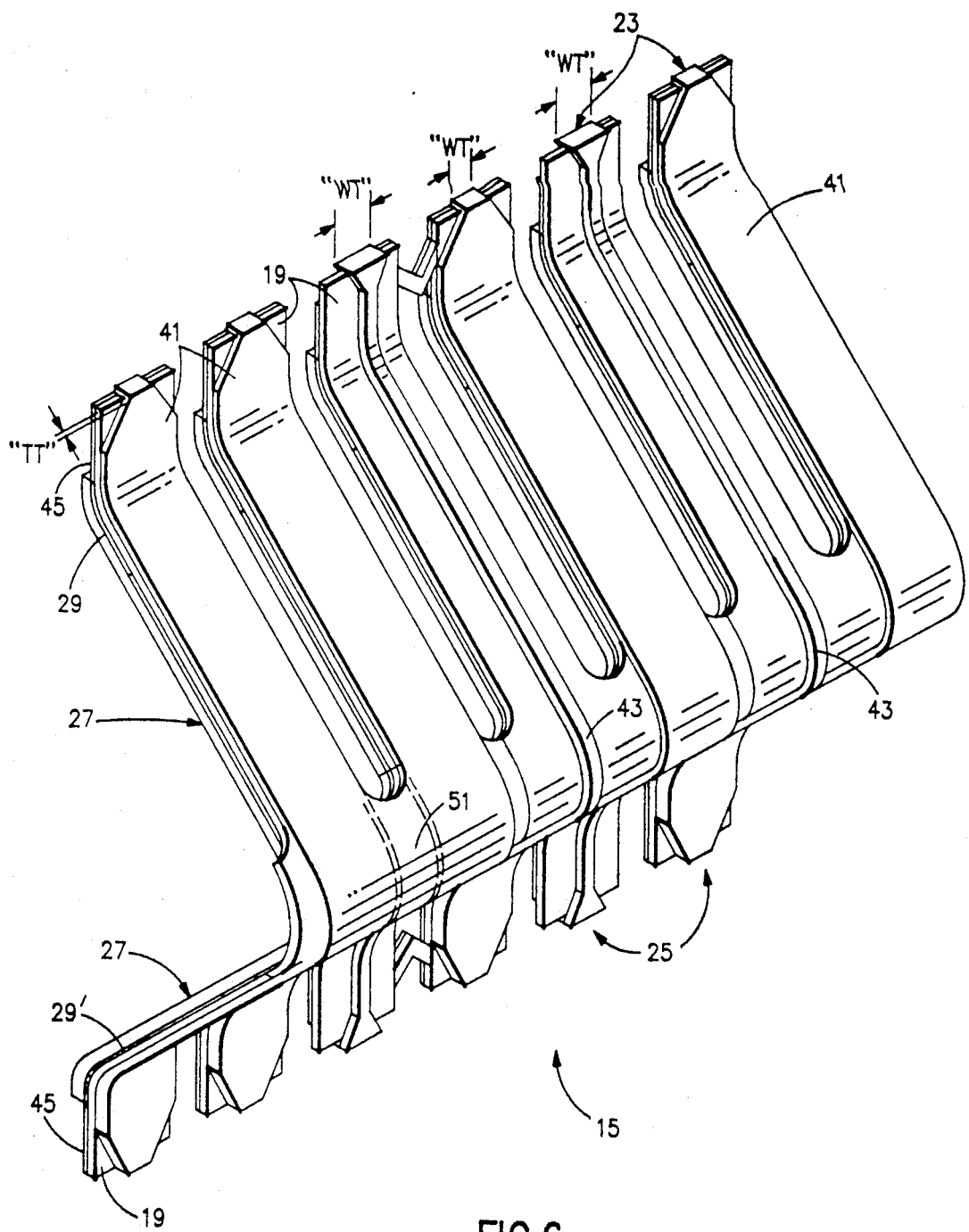
FIG. 6 is a perspective view of one embodiment of an elongated flexible circuit member adapted for use in the connector of FIG. 1, illustrating a plurality of conductive elements spacedly positioned thereon.

Each flexible circuit member 15, as shown in FIG. 1 and seen in greater detail in FIG. 6, includes both a plurality of first and second opposing end portions (23 and 25 respectively) fitted on or, preferably, formed as part of an array of conductive elements 41, 43 and 45. The array of elements 41, 43 and 45, as shown in FIG. 2, is adapted for engaging the defined individual flat conductive pads 31. The cross-sectional area (width and thickness) of individual conductive elements 41, 43 and 45 can be varied to optimize both the electrical and mechanical performance for the particular function (signal, power, or ground) that each performs. For example, because of the lower electrical resistance desired for these elements, wider conductive elements 41 may be better suited for use as power conductors than narrower elements 43. When used as signal conductors, narrower elements may have a lower coupled noise, provided the space between adjacent conductors is greater.

The addition of one or more conductive elements 45 (which may serve either as a ground plane or as an additional conductive layer) on the back side of dielectric layer 19 (as best shown in FIG. 6), may enhance the electrical performance of corresponding elements 41, 43 on the front side of dielectric layer 19 in certain applications. The addition of connecting conductive means 49 (FIG. 6) to electrically connect one conductive element 45 on the back side of the dielectric layer 19 to a neighboring (preferably adjacent) conductive element 45 may further enhance the electrical performance of elements 43. The vertical location of conductive means 49 (relative to the closeness to the extreme ends 23 and 25) provides connector 10 with a means for modifying mechanical and electrical performance. Specifically, having the conductive means 49 closer to ends 23 and 25 is electrically superior since the ground plane current may more closely follow the path of the signal element 43. This may be less desirable mechanically, however since the ends of two adjacent elements are more tightly coupled, thereby reducing element-to-element compliance. The further the conductive means 49 is located toward central curved portion 21, the mechanical coupling between adjacent elements is reduced, but this may be less desirable, electrically, because the impedance of the section of element 43 that does not have a ground plane present may be higher than the impedance for the rest of element 43. In a preferred embodiment, conductive means 49 is substantially "V-shaped" (as opposed to a simple, straight horizontal bar) in order to have conductive means 49 mechanically act as a beam instead of a rigid plate. This further reduces the mechanical coupling between adjacent members that is due to variation in tip deflections which may be caused by component tolerances, differences in pad height, thermal expansion, etc.). The construction of conductive means 49 preferably occurs as part of the construction of the rest of the elements 45, although these may be added later through other means such as wire bonding, etc.

The application of the two concepts described above to connector 10 can best be seen in the middle pair on conductors in FIG. 6. In this embodiment, the wider element 41, which is preferably at either ground or power voltage level, is electrically commoned to the conductive element 45 on the back side of the dielectric layer 19 through end portions 23 and 25. Conductive means 49 electrically commons element 45 behind the wider element 41 to the element 45 behind narrower element 43. This in effect provides a reference plane for a signal-carrying element 43, which in turn creates a microstrip transmission line structure that significantly improves the signal characteristics, such as controlling impedance, of element 43. This same concept can be applied to the situation where element 43 is a wider conductor to be used to carry power. In that situation, the effective inductance of element 43 is reduced due to the proximity of ground/reference elements 45.

Alternatively, it is also possible to incorporate as part of member 15 one or more coupling metallic portions 51 (shown in phantom) which, like elements 41, 43 and 45 in FIG. 6, are capable of providing a common connection to two or more opposing pairs of conductive pads 31. Portion 51 in FIG. 6 is shown to couple two elements 41 as part thereof. Thus, in the embodiment of FIG. 6, it is possible to combine signal and power functions utilizing a singular flexible circuit member. Understandably, dielectric material 19 is of sufficient thickness to maintain the individual contacting sections in the desired spaced orientation so as to assume an overall, elongated configuration such as shown in FIG. 6. In such an embodiment, the conductive elements 41, 43 possess a thickness, preferably, of only about 0.0028 inch and a width of 0.03 and 0.004 inch respectively, while the corresponding dielectric layer (e.g., polyimide) possesses a thickness of about 0.003 inch. Conductive elements 45 possess a thickness, preferably, of only about 0.00035 inch and a width of 0.03 inch, and are thus slightly thinner than corresponding elements 41, 43.

The presence of elements 45 functioning as a ground plane provides the additional benefit of essentially shielding elements 43 (if used as signal elements) from adjacent members 15, thereby reducing possible coupled noise generated from those members 15 to relatively low levels.

Spring means 27, as shown in FIG. 2, may be either partially or completely vertically segmented to enhance its mechanical properties (i.e. the compliancy of adjacent end portions 23 and 25). In the embodiment shown in FIG. 6, spring means 27 may comprise a plurality of individual spring elements, each of which is substantially equal in width to the respective dielectric layer 19 lying thereover as well as the wider, corresponding conductive element 41 in the region other than the curved central portion 21. In that region, such spring elements may be mechanically connected together to form an elongated, assembled structure. This may enhance the manufacturability of the spring means since it can be preferably formed as a single piece through a process such as stamping while still substantially minimizing the mechanical coupling between the end portions 23 and 25 of elements 41, 43 and 45 that would occur if the spring means were one solid piece.

It is significant to note that spring means 27 should preferably be electrically commoned either to conductive elements 45 (if these are used) or to one or more conductive element 41, 43 (at a power or ground potential), preferably at one of the upper and lower locations 29 and 29', respectively, to ensure that the spring means is at a defined voltage level and does not impair the performance of elements used to carry signals.

Additionally, in the embodiment show in FIG. 6, the shape of end portions 23 and 25 of elements 41 may narrow closer to the tip of the end portion, while the shape of narrower elements 43 may widen. This is done, significantly, to allow greater alignment tolerances between ends 23 and 25 and conductive pads 31 as well as to ensure that ends 23 and 25 of all width elements perform substantially the same from a mechanical point of view. Furthermore, additional conductive material (i.e. an additional layer of copper, etc.) may be added to ends 23 and 25 to offset the reduction of cross sectional area of especially the wider elements 41 that may be used as power conductors. However it is understood that the use of other shapes and/or contours of the end portions may be used and are well within the scope of this invention. In the embodiment shown in FIG. 6, the tips may possess a width (dimension "WT") of about 0.015 inch. and a thickness (dimension "TT") of about 0.0028 to 0.0056 inch.

Alignment of the two circuit members 33 and 35 relative to interim connector 10 may be provided utilizing a pair of protruding pins 81 which extend from one of the circuit members (e.g., module 33), these pins being aligned with and positioned within corresponding openings 83 within housing parts 11a and 11b and openings 85 within the other of these circuit members. It is understood that other means of alignment are readily possible, including the provision of pins extending from opposing surfaces (upper and lower) of housing parts 11a and 11b for insertion within corresponding openings within the respective circuit members. To adjust for tolerancing, one of such openings within connector 10 may be of elongated configuration, as illustrated in FIG. 1.

To enable cooling of the flexible circuit members 15 within housing 11, including during operation of connector 10, one or more slots 67 (when parts 11a and 11b are combined) may be provided within at least one of the walls of the housing (FIG. 1). Preferably, these slots are provided in opposing walls 13b and 13d to enable fluid coolant (liquid or gas) to readily pass through the parallel aligned and closely spaced flexible circuit members and associated spring means. A preferred coolant is air. It is also possible to use nitrogen and oil for this purpose. It would be highly desirable to provide a sealed system through the use of bladders, tubes, etc. (not shown) if liquids are to be used as the coolant. Should connector 10 be utilized solely as a power connector, temperatures may be reduced by approximately fifty percent, thus enhancing the operation of the invention.

To further assure prevention of accidental shorting with adjacent such flexible circuit members 15, each member 15 and spring means 27 may include the aforementioned relatively thin layer 47 of dielectric material (shown in phantom in FIG. 5) over a major portion thereof. Each layer, as stated, is of a dielectric material, a preferred example being polyimide. Although only member 15 is shown in FIG. 5 to include this layer, the layer may also be provided on the outer surface of spring means 27 (the left side in FIG. 5).

Figure 11:
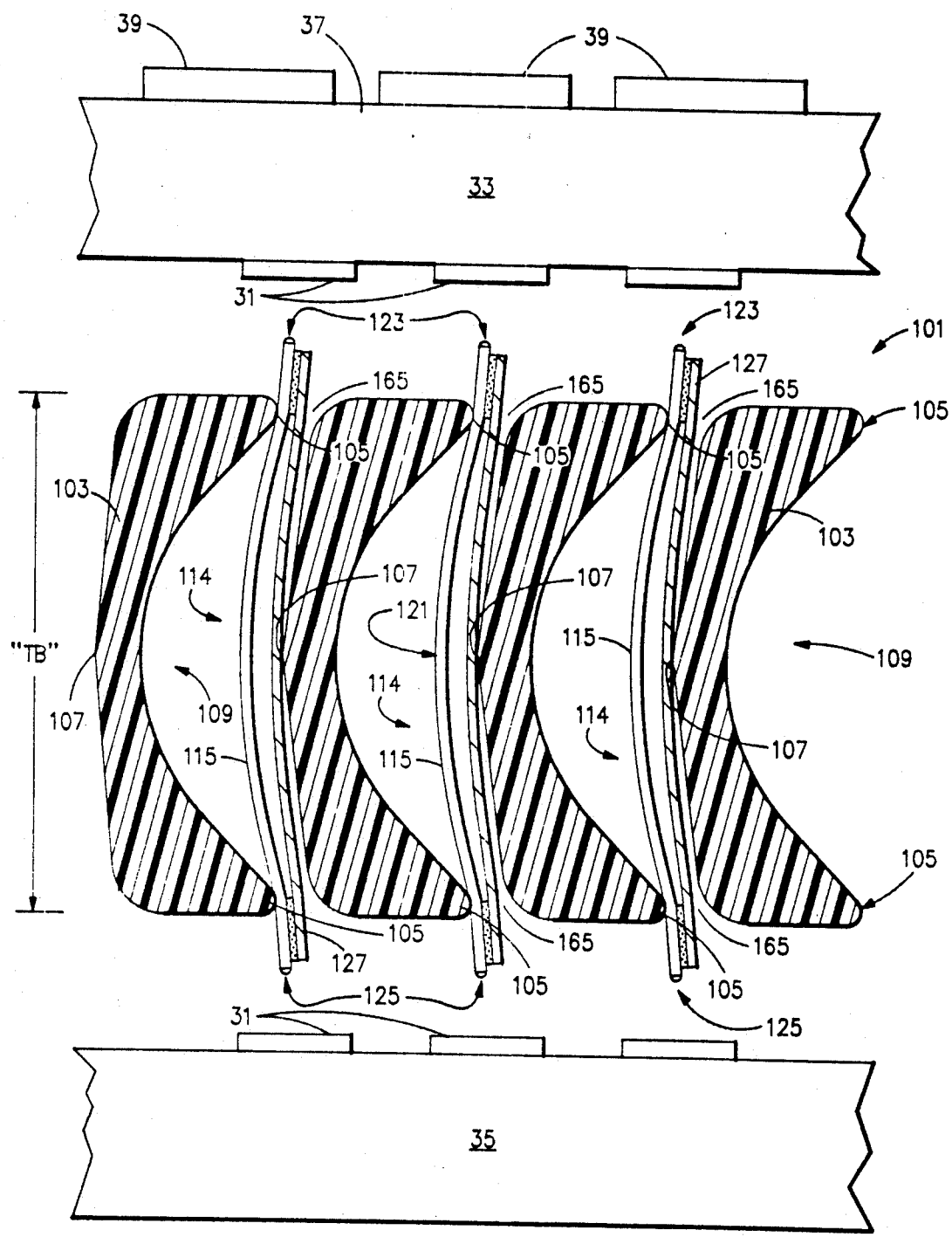
FIG. 11 illustrates, in a partial side, sectional view, an electrical connector in accordance with another embodiment of the invention prior to circuit member engagement (and prior to positioning member movement)
Figure 16:
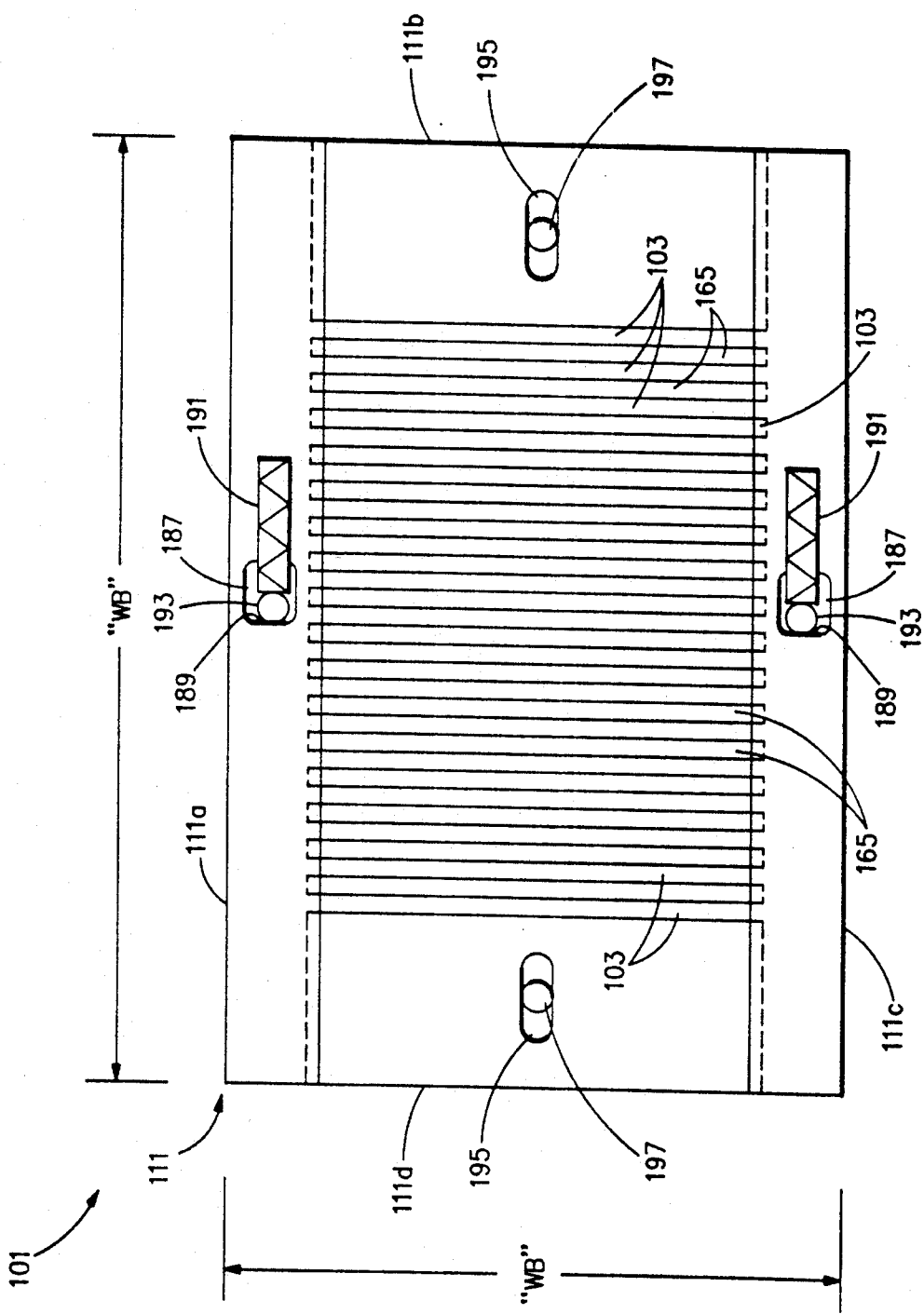
FIG. 16 is a top view of the connector of FIG. 11, on a smaller scale, including a housing in accordance with one embodiment of the invention.

In FIG. 11, there is shown a connector 101 for electrically interconnecting a pair of circuit members 33 and 35, in accordance with another embodiment of the invention. Connector 101, as also shown in FIG. 16, comprises a housing 111 including, preferably, four parts (opposing end parts 111a and 111c, and opposing side parts 111b, and 111d), preferably molded and of an electrically insulative, e.g., plastic, material and, as illustrated, preferably of substantially a rectangular configuration. In one example of the invention, housing 111 may possess a width (dimension "WB") of about 1.8 inches. This housing may also possess a combined thickness (dimension "TB", FIG. 11) of only about 0.17 inch. As stated, the preferred material for housing 111 is plastic, with suitable examples of such material being Vectra (a trademark of Hoechst Celanese Corporation), Ryton (a trademark of Phillips Petroleum Company), phenolic, and polyester. Housing 111, as defined, is adapted for being positioned between a pair of electrical circuit members 33 and 35 to thus form part of connector 101, which understandably serves to interconnect said circuit members.

Figure 12:
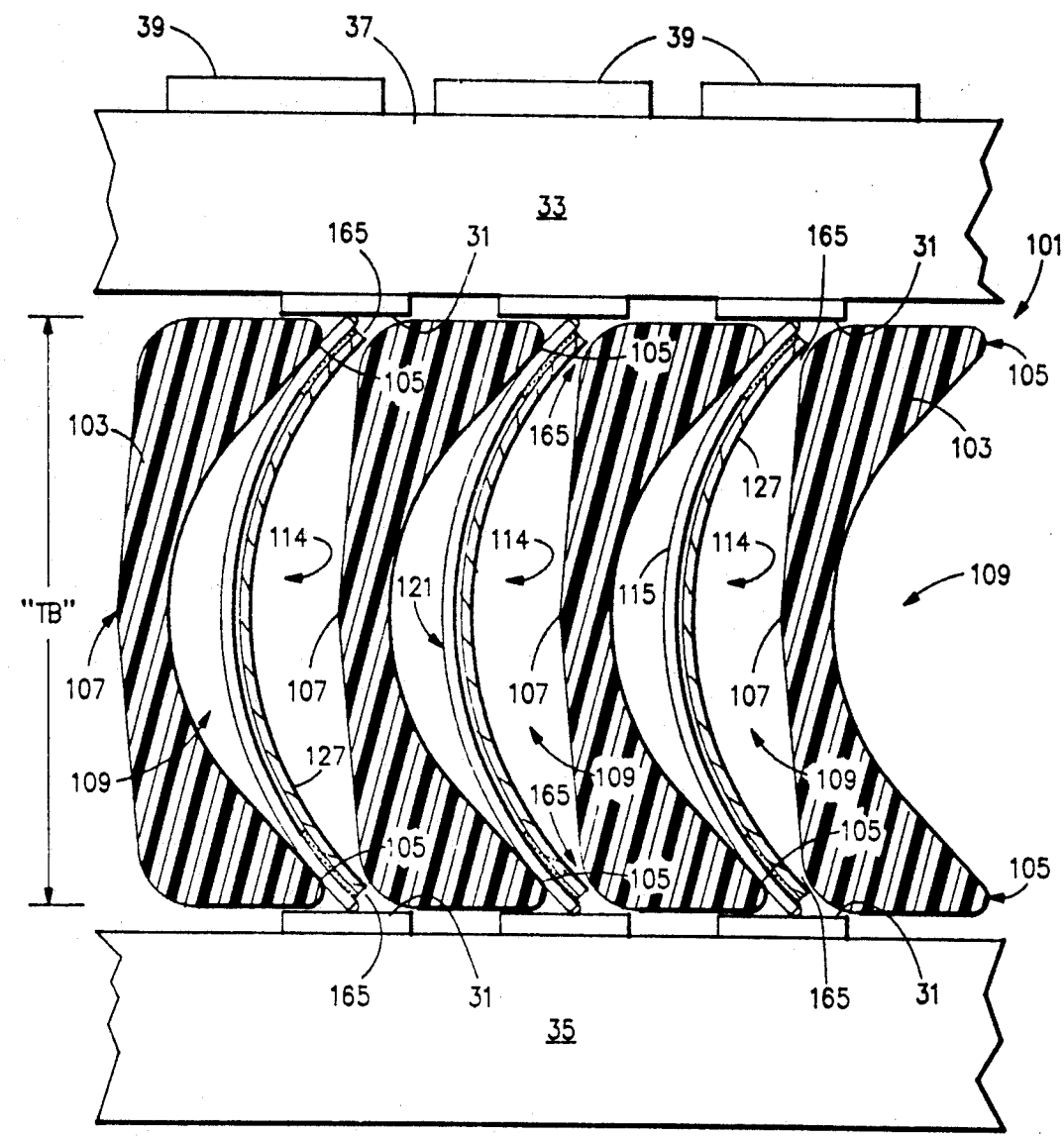
FIG. 12 is a partial side view, in section, of the connector of FIG. 11, during circuit member engagement.

Connector 101, as illustrated in FIGS. 11 and 12, includes at least one (and preferably a plurality of) elongated, compressible contact member 114 positioned within housing parts 111a-111d. Although three such members are shown in FIGS. 11 and 12 for illustration purposes, it is understood that several additional such members may be used (and are preferably so) as part of the invention. In one embodiment of the connector of the invention, for example, a total of about 25 such members may be used. It is understood that these contact members 114 substantially abut the internal surfaces of opposing housing end parts 111a and 111c. By the term substantially abut is meant that slight engagement by each member 114 at one or both opposite ends thereof with a respective, adjacent housing part may occur. These members are thus arranged in substantially parallel, spaced orientation within housing 111.

Figure 13:
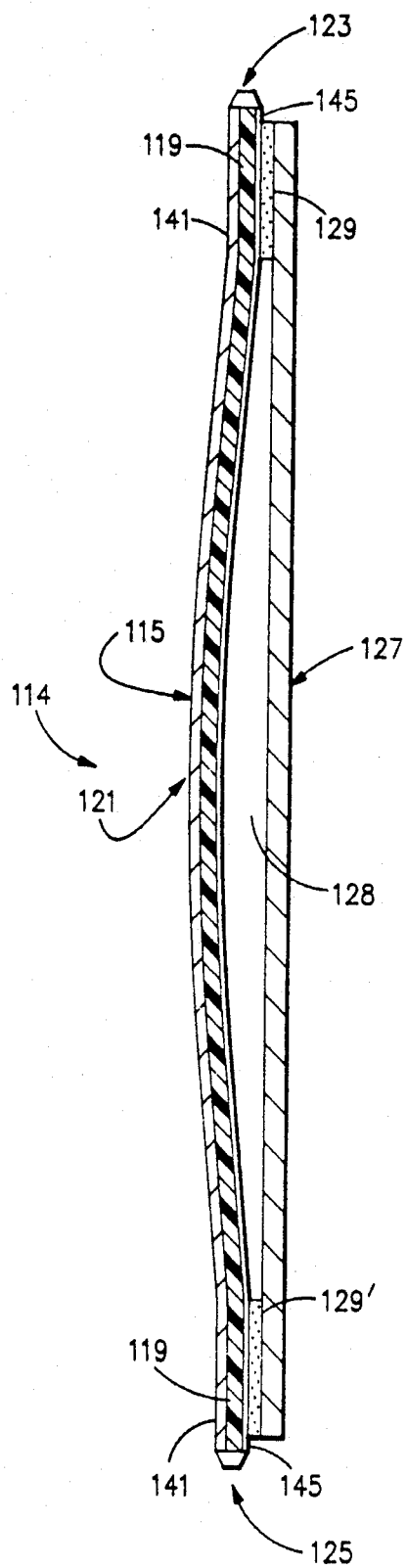
FIG. 13 is a side view, in section, of a elongated flexible circuit member and spring means which may be used in the embodiment of the invention shown in FIG. 11, in a relaxed state prior to positioning thereof within the invention's housing.

A more detailed illustration of each contact member 114, taken in section, is seen in FIG. 13. Each contact member 114 preferably includes a flexible circuit member 115 having one or more conductive elements 141, 143, and 145 (FIG. 15), preferably of copper (or similar metallic material including e.g., phosphor bronze, beryllium-copper, etc.) on at least one side of a dielectric (e.g., polyimide) layer 119. Significantly, copper is the preferred material for the conductive elements 141, 143, and 145 because of its relatively low electrical and thermal resistivity compared to other metals commonly used in connectors. Preferably, conductive elements 141, 143 and 145 and end portions 123 and 125 are also plated with corrosion-resistant, sound conducting metallic material such as nickel, gold, silver, palladium, etc. The functionality of connector 101 may be further enhanced by the inclusion of penetrating-type contact geometries such as dendritic elements 77 (described in greater detail below regarding FIGS. 7-10) on the end portions 123 and 125 of flexible circuit member 115 to enhance the reliability of the connections by offering contact redundance, which in turn reduces contact resistance, heat dissipation, and the temperature in the contacts during operation. Furthermore, dendritic elements 77 can break through dust, films, and fibrous debris that may be present on such conductive pads 31 as those shown for circuit members 33 and 35.

Conductive elements 145 on the backside of dielectric layer 119 may be selectively commoned electrically to conductive elements 141, 143 on the opposite side of the dielectric layer 119 through end portions 123 and 125 (shown in FIG. 13), although it is understood that alternate means of electrically connecting the two sides (e.g., vias, plated through holes, etc.) are possible and thus within the scope of this invention.

Further shown in FIG. 13 is spring means 127, preferably of maraging or stainless steel, which is connected to the conductive element 145 on the backside of dielectric layer 119 (or directly to the dielectric layer 119 if conductive elements 145 are not present) in at least two separate locations, preferably near the ends 123 and 125 (e.g., at locations 129 and 129' in this embodiment), by attachment means such as soldering, welding, or use of either conductive or nonconductive adhesive. Such an adhesive is preferred if means 127 is connected directly to dielectric layer 119. Flexible circuit member 115 and spring means 127 are not shown in cross-section in FIGS. 11 and 12 for ease of illustration. These elements are shown in cross-section in the larger views in FIGS. 13 and 14.

Figure 14:
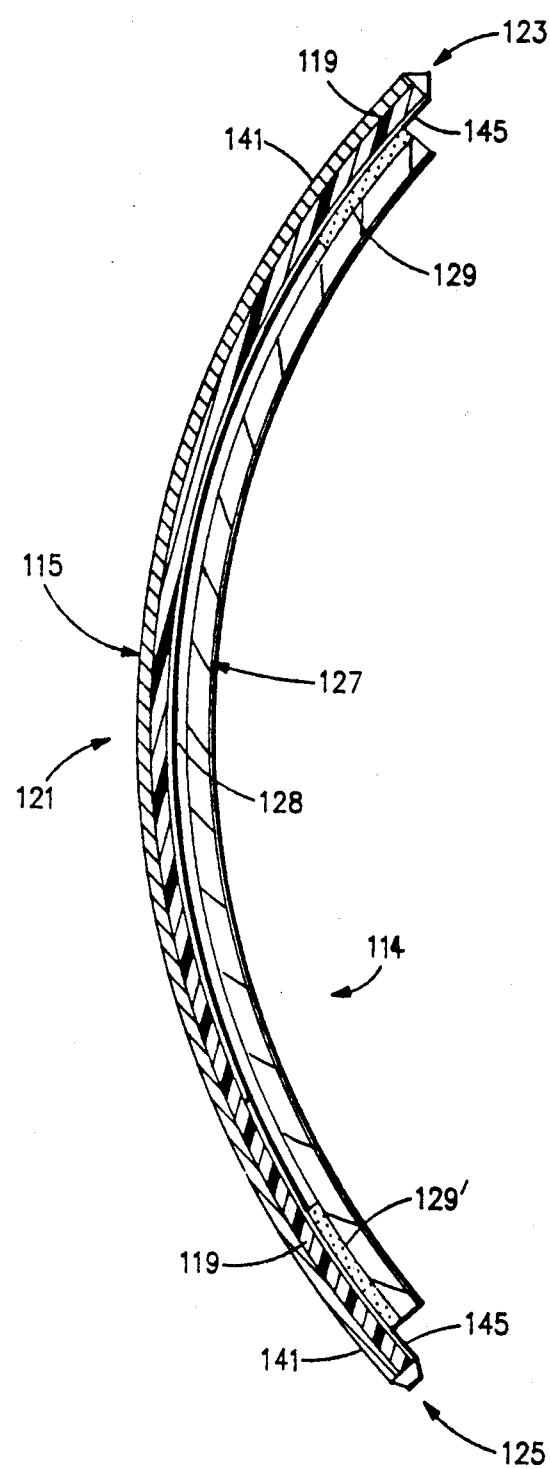
FIG. 14 is a side view, in section, of the member of FIG. 13 in an actuated position (the remaining parts of the invention not shown, for illustration purposes)

During the process of attaching spring means 127, a space 128 is formed in the middle portion 121 between the spring means 127 and flexible circuit member 115 in order to reduce the maximum stress in the middle portion 121 of the flexible circuit member 115 both during and following actuation of connector 101. More specifically, this space allows spring means 127 and flexible circuit member 115 to deform independently (each with respect to its own neutral axis), thereby reducing the maximum bending stresses in each. In contrast, in a composite member (i.e. one in which spring means 127 and flexible circuit member 115 are laminated together along their entire length and are restrained from sliding with respect to each other at the lamination interface), a single neutral axis is developed such that the maximum distance of a point in the composite from the neutral axis will be greater than in the previous case, thereby increasing the maximum bending stresses in both spring means 127 and flexible circuit member 115. As can be seen in FIG. 14, which shows contact member 114 in its actuated state, the above-mentioned space between the spring means 127 and conductive element 145 is reduced but still present.

The space formed between spring means 127 and flexible circuit member 115 not only reduces the stress in each, but also substantially reduces the combined stiffness as well, for the reasons stated above with respect to flexible circuit member 15 and spring means 27.

Additionally, maraging steel is a preferable material for spring means 127, again for the same reasons stated above.

Figure 15:
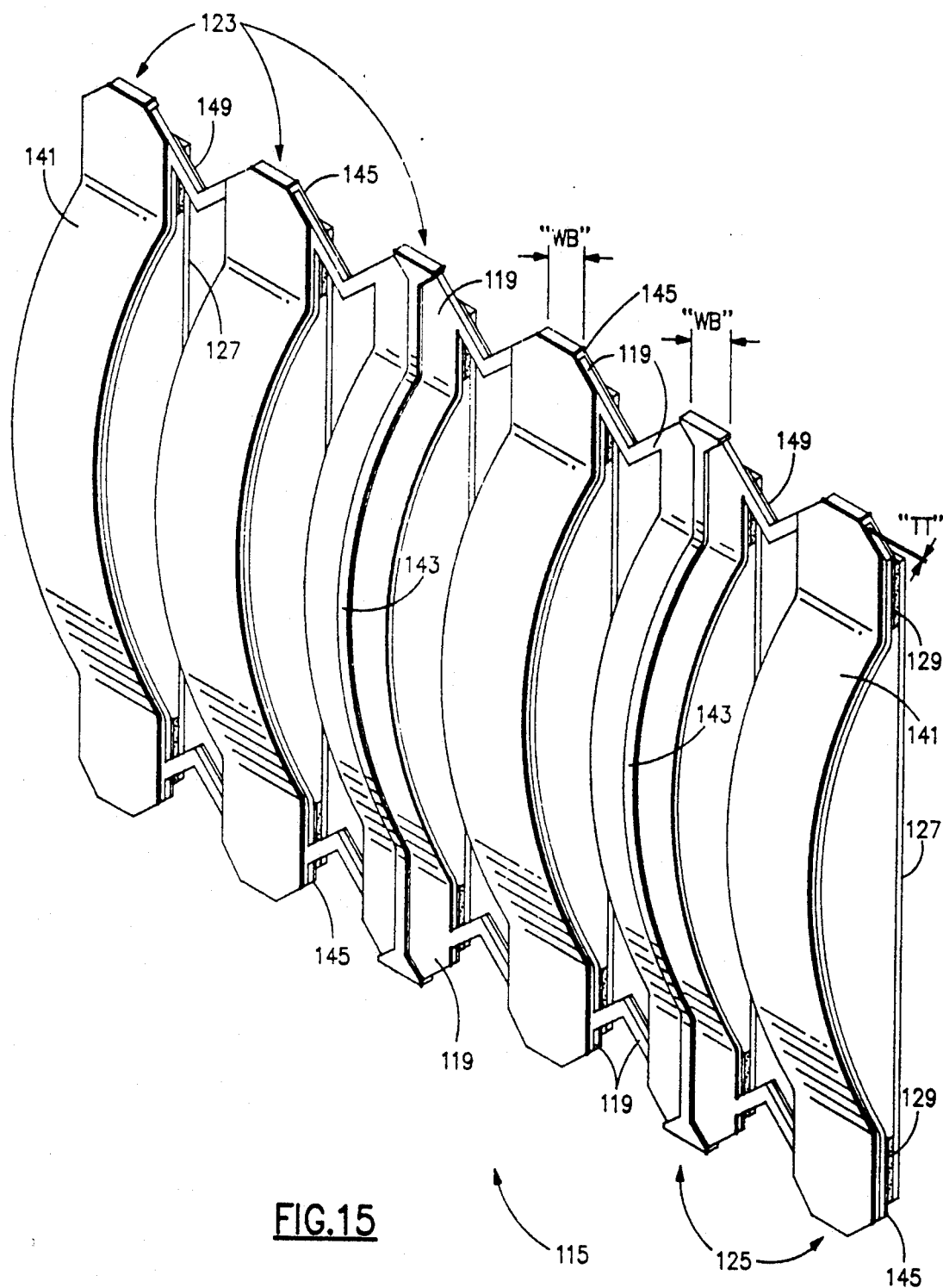
FIG. 15 is a perspective view of an elongated flexible circuit member illustrating a plurality of conductive elements spacedly positioned thereon.

Each flexible circuit member 115, as shown in FIGS. 11 and 12 and seen in greater detail in FIG. 15, includes both a plurality of first and second opposing end portions (123 and 125 respectively) fitted on or, preferably, formed as part of an array of conductive elements 141, 143 and 145. The array of elements 141, 143 and 145, as shown in FIG. 11, is adapted for engaging the defined individual flat conductive pads 31. The cross-sectional area (width and thickness) of individual conductive elements 141, 143 and 145 can be varied to optimize both the electrical and mechanical performance for the particular function (signal, power, or ground) that each performs similarly to elements 41, 43 and 45 defined above. For example, because of the lower electrical resistance desired for these elements, wider conductive elements 141 may be better suited for use as power conductors than narrower elements 143. When used as signal conductors, narrower elements may have a lower coupled noise, provided the space between adjacent conductors is greater.

In the embodiment as shown in FIG. 15, the conductive elements 141, 143 possess a thickness, preferably, of only about 0.0014 inch and a width of 0.03 and 0.004 inch respectively, while the corresponding dielectric layer (e.g., polyimide) possesses a thickness of about 0.002 inch. Conductive elements 145 possess a thickness, preferably, of only about 0.00035 inch and a width of 0.03 inch, and are thus slightly thinner than corresponding elements 141, 143.

Similarly to the flexible circuit structure in FIG. 6, the addition of one or more conductive elements 145 (which may serve either as a ground plane or as an additional conductive layer) on the back side of dielectric layer 119 (as best shown in FIGS. 13-14), may enhance the electrical performance of corresponding elements 141, 143 on the front side of dielectric layer 119 in certain applications. The addition of connecting conductive means 149 (as best shown in FIG. 15) to electrically connect one conductive element 145 on the back side of the dielectric layer 119 to a neighboring (preferably adjacent) conductive element 145 may further enhance the electrical performance of elements 143. The vertical location of conductive means 149 (relative to the closeness to the extreme ends 123 and 125) provides connector 101 with a means for modifying mechanical and electrical performance. Specifically, having the conductive means 149 closer to ends 123 and 125 is electrically superior since the ground plane current may more closely follow the path of the signal element 143. This may be less desirable mechanically, however since the ends of two adjacent elements are more tightly coupled, thereby reducing element-to-element compliance. The further the conductive means 149 is located toward middle portion 121, the mechanical coupling between adjacent elements is reduced, but this is less desirable, electrically, because the impedance of the section of element 143 that does not have a ground plane present will be higher than the impedance for the rest of element 143. Conductive means 149 is substantially "V-shaped" (as opposed to a straight horizontal bar) for the reasons stated above with respect to means 49 (FIG. 6).

The application of the two concepts described above to connector 101 can best be seen in the middle pair on conductors in FIG. 15. In this embodiment, the wider element 141, which is preferably at either ground or power voltage level, is electrically commoned to the conductive element 145 on the back side of the dielectric layer 119 through end portions 123 and 125. Conductive means 149 electrically commons element 145 behind the wider element 141 to the element 145 behind narrower element 143. This in effect provides a reference plane for a signal-carrying element 143, which in turn creates a microstrip transmission line structure that significantly improves the signal characteristics, such as controlling impedance, of element 143. This same concept can be applied to the situation where element 143 is a wider conductor to be used to carry power. In that case the effective inductance of element 143 is significantly reduced due to the proximity of ground/reference elements 145.

Alternatively, as an extension to the embodiment shown in FIG. 15, it is possible to incorporate as part of member 115 one or more coupling metallic portions (not shown) between adjacent elements which, like elements 141, 143 and 145 in FIG. 15, are capable of providing a common connection to two or more opposing pairs of conductive pads 31. In one embodiment, a metallic portion may be used to thus couple two elements 141 as part thereof. Thus, in this embodiment, it is possible to combine signal and power functions utilizing a singular flexible circuit member. Understandably, dielectric layer 119 is of sufficient thickness to maintain the individual contacting sections in the desired spaced orientation so as to assume an overall, elongated configuration such as shown in FIG. 15.

As in flexible circuit member 15, the presence of elements 145 functioning as a ground plane provides the additional benefit of essentially shielding elements 143 (if used as signal elements) from adjacent members 115, thereby reducing possible coupled noise generated from those members 115 to extremely low levels.

Additionally, in the embodiment show in FIG. 15, the shape of end portions 123 and 125 of elements 141 may narrow closer to the tip of the end portion, while the shape of narrow elements 143 may widen. This is also done for the same reasons cited above. In the embodiment shown in FIG. 15, the tips may possess a width (dimension "WTB") of about 0.015 inch. and a thickness (dimension "TTB") of about 0.0014 to 0.0028 inch.

Spring means 127, as shown in FIG. 11, may be either partially or completely vertically segmented to enhance its mechanical properties (i.e. the compliancy of adjacent end portions 123 and 125). In the embodiment shown in FIG. 15, spring means 127 may comprise a plurality of individual spring elements, each of which is substantially equal in width to the dielectric layer 119 lying thereover as well as the corresponding, wider conductive element 141 in the region other than the middle portion 121. In that region, such spring elements may be mechanically connected together to form an elongated, assembled structure, as in the case of spring means 27, and for the same reasons.

Spring means 127, like spring means 27, should preferably be electrically commoned either to conductive elements (145, if these are used) or to one or more conductive element (141, 143, at a power or ground potential), preferably at one of the upper and lower locations 129 and 129', respectively, to ensure that the spring means is at a defined voltage level and does not impair the performance of elements used to carry signals.

Significantly spring means 127, which acts mechanically as a buckling beam in the preferred embodiment, allows for a narrow range of contact force over a wide range of vertical compliancy. For example, in one embodiment of connector 101, a vertical compliancy range of greater than 0.020 inch is achieved with less than a ten percent variation in force. In comparison, typical area array connector presently available have a usable vertical compliancy range of less than 0.010 inch over a variation in force of 100–300 percent. Additionally, the use of a buckling beam-type spring means 127, allows the length of conductive elements 141, 143 and 145 to be reduced. This improves both the electrical (from both a signal and power carrying point of view) and thermal properties of connector 101.

It is also significant to note that end portions 123 and 125 of flexible circuit members 115 are at maximum force almost immediately after initially contacting conductive pads 31, and substantially maintain that same force during the remainder of actuation. Significantly, contact members 114 of this particular embodiment of the invention are capable of occupying a first, prestressed condition prior to engagement with circuit members 33 and 35 (such prestressing caused by engagement with a positioning member, as defined in greater detail below) and thereafter moving to a second position in which these members are in a compressed state. This will be better understood from the following description. Such compression is shown in FIG. 12 and occurs after the contact's ends 123 and 125 have engaged respective pads 31. Contact members 114 are thus in a prestressed condition in FIG. 11, prior to such engagement. Additionally, connector 101 does not have to be overdriven to achieve a minimum force per contact (such may be the case for connectors with larger force variation), thus rendering the invention capable of minimizing unnecessary clamping forces on circuit members 33 and 35.

Connector 101, as illustrated in FIGS. 11 and 12, further includes at least one (and preferably a plurality) of the aforementioned, elongated, electrically insulative positioning members 103. Each positioning member 103 preferably includes a cross section of substantially convex shape on one of its vertical sides and a substantially concave shape on the opposite side, and is of polymer material, suitable examples of such material being Vectra, Ryton, phenolic, and polyester. Member 103 is preferably manufactured by a process such as molding or extrusion (extrusion allows for modular construction of the connector assembly, thus lending the device to be customized in any array configuration), and is held in position by opposing housing end parts 111a and 111c. Positioning members 103, each acting against an adjacent contact member 114, cause members 114 to occupy the described prestressed position (in FIG. 11, immediately prior to direct engagement with pads 31) and thereafter move to the left in FIG. 12 to enable the contact members 114 to fully compress (FIG. 12). Positioning members 103 are each designed to engage an adjacent flexible circuit member 115 (of member 114) initially at two outer locating surfaces 105 and one inner locating surface 107, slightly deflecting the a centered, slightly bowed, free-floating, prestressed condition prior to circuit member 33 and 35 engagement Each flexible circuit member 115 is retained by friction between the three surfaces of contact (105 and 107) and the bowed flexible circuit members as shown in FIG. 11. This slightly bowed form predisposes the bending direction of the flexible circuit members so that during the actuation of connector 101, all of the flexible circuit members deflect in the same direction In cases where additional retention of flexible circuit member 115 is desired, tabs (not shown), which may be captured by opposing housing end parts 111a and 111c (e.g. by mating grooves), may be included as part of the edges of flexible circuit member 115. Additionally, the outer locating surfaces 105 of each positioning member 103 and the substantially convex-shaped part of the adjacent positioning member 103 immediately to its right (as shown if FIGS. 11 and 12) define a pair of slots 165 through which end portions 123 and 125 of each flexible circuit member 115 extend.

Positioning members 103, as shown in FIG. 16, are secured to or form part (extensions) of opposing housing end parts 111a and 111c and thus move when these parts move. Such securement may be achieved using a suitable adhesive, or these members may be press fit into parts 111a and 111c. (Contacts 114 are not shown in FIG. 16 for illustration purposes). Alternatively, positioning members 103 may be formed as integral parts of the housing (e.g., molded as either a single piece, or, as described above for connector 10, as upper and lower halves). Although such a construction may hinder the possibility of modular construction, it may be more cost effective for those embodiments of connector 101 that are intended to be produced in large quantities.

Opposing housing end parts 111a and 111c, shown in FIG. 16, further include one or more X-axis alignment slot 187, X-axis alignment surface 189, and biasing means 191, which, when used in conjunction with X-axis alignment pin 193 (which may be part of either circuit member 33 or 35 as in the example of pins 81 in FIG. 1), comprise the X-axis alignment means to align connector 101 to circuit members 33 and 35, as well as to align member 33 to member 35. Pin 193 (and pin 197, described below) may be secured to members 33 and 35 by suitable means such as adhesive, brazing, and/or frictional fitting. Biasing means 191, preferably a coil spring which has a relatively light spring force (e.g., one pound) compared to the amount of force needed to actuate all of the flexible circuit members and spring means of connector 101, positions each X-axis alignment surface 189 against its corresponding X-axis alignment pin 193. Biasing means 191 also accurately returns housing 111 to its initial location (FIG. 11) during deactuation of connector 101. Housing 111 may further include one or more standoffs (not shown), which may be used to define the minimum vertical distance between circuit members 33 or 35 and positioning members 103 and the rest of housing 111. Opposing housing side parts 111b and 111d, also shown in FIG. 16, include one or more Y-axis alignment slots 195, which, when used in conjunction with Y-axis alignment pin 197 (which may be part of the same alignment means to align connector 101 with respect to members 33 and 35, as well as to align member 33 to member 35. Once positioning members 103 are secured to the housing 111 (including alignment means described above), flexible circuit members 115 with associated spring means 127 may be inserted into the openings 109 defined between members 103 to complete the assembly of connector 101 as best seen in FIGS. 11 and 12. Since each flexible circuit member 115 is retained by the corresponding outer locating surfaces 105 and inner locating surface 107 of members 103 (which are mechanically coupled to housing 111 prior to the actuation of connector 101), housing 111 aids in the alignment of end portions 123 and 125 of flexible circuit members to respective conductive pads 31.

In the preferred embodiment of connector 101, housing 111 differs from current state-of-the-art technology since it is not held in a rigid, fixed position during actuation of the connector. During the engagement of connector 101 into its final actuated position (FIG. 12), flexible circuit members 115 and spring means 127 are compressed causing the increasing arcuate formation of the same. This removes the force exerted on each flexible circuit member from corresponding inner locating surface 107 and causes each member 115 to push on the respective two outer locating surfaces 105, displacing housing 111 in the same direction that the flexible circuit members are bowing, thereby allowing the unimpeded vertical actuation of flexible circuit members 115 and electrical circuit members 33 and 35 to thus form part of connector 101, which understandably serves to interconnect said circuit members. Housing 111 is thus movable in response to compression of contact members 114 within openings 109, members 114 slidably engaging the housing's positioning members 103 during this compressive engagement. The housing, via members 103, also serves to positively engage contact members 114 prior to such circuit member compression, thereby aligning these as needed.

The operation and functionality of connector 101 are greatly enhanced by allowing the housing to so move both during actuation and deactuation of the connector. Two benefits of this are a substantial reduction in the amount of force needed to actuate the connector while minimizing the possibility of the crushing of the end portions of the flexible circuit members. It is possible that if the housing is not allowed to move during actuation of the connector, the end portions, which may already have a high coefficient of friction with conductive pads 31, may try to wipe against the pads, but because of the possible interference between the bowing end portions of the flexible circuit members and the outer locating surfaces 105, the end portions may have a tendency to bend in a direction opposite of the direction of bow.

To enable cooling of the flexible circuit members 115 within housing 111, including during operation of connector 101, one or more slots (not shown) may be provided similarly to housing 11 in FIG. 1. Preferably, these slots are provided in housing end parts 111a and 111c to enable fluid coolant (liquid or gas) to readily pass through the parallel aligned and closely spaced flexible circuit members (in the embodiment shown in FIG. 16, this may require the slight relocation of X-direction alignment means to improve the flow of the coolant). A preferred coolant is air. It is also possible to use nitrogen and oil for this purpose. It may be desirable to provide a sealed system through the use of bladders, tubes, etc (not shown), if liquids are to be used as the coolant. Should connector 101 be utilized solely as a power connector, temperatures may be reduced by approximately fifty percent, thus enhancing the operation of the invention.

As an alternative embodiment, the contact members in FIGS. 11-16 may include conductive elements 141 and 143 (e.g., of beryllium-copper) on only one side of the dielectric layer. Beryllium-copper is the preferred material or the conductive elements because it performs the electrical functions of the flexible circuit member (e.g. provide conductive paths) and also provides the mechanical functions of (and thereby eliminates the need for) spring means 27. This simplifies the manufacture of the conductive means thereby reducing the overall cost of the connector. Thus, by the term contact member as used in this embodiment of the invention is meant to include combined flexible circuit and spring means structures, as well as a singular member comprised, e.g., of dielectric having a metallic layer thereon.

In FIGS. 7-10, there is shown a method for making conductive end portions 23 and 25 of flexible circuit member 15 of connector 10 (and also conductive end portions 123 and 125 of the flexible circuit member 115 of connector 101) in accordance with a preferred embodiment of the invention. FIG. 7 shows an end portion of the dielectric layer 19 and the conductive elements 41 and 45, taken in cross section, prior to the formation of dendritic elements (77, described below) on the end portions of the flexible circuit member.

FIG. 8 shows the end of flexible circuit member 15 after an opening 71 is provided near the tip of the end portion, this opening extending through both dielectric layer 19 and conductive elements 41 and 45. Opening 71 may be formed by means such as punching, drilling, etching or ablation (e.g., laser). Surface 73 of opening 71 is then made electrically conductive by adding a conducting layer 75 using a known method such as additive plating. Preferred materials for the conducting layer 75 are copper, nickel, gold, silver, palladium, etc. Significantly, and as previously described, the conducting layer may be used to electrically common conductive elements on one side of dielectric layer 19 to conductive elements on the other side. In one embodiment, a first layer of copper (e.g., 0.0007 inch thick) was added, followed by a thin layer (e.g., 0.00002 inch) of nickel (as a corrosive barrier to enhance dendrite adhesion), followed by a thin layer (e.g., 0.00002 inch) of palladium. Dendritic elements (77) were then added.

FIG. 9 shows a conductive end portion after the conducting layer 75 (or layers, as defined above) of opening 71 has been plated with a plurality of dendritic elements 77 by a method such as electroplating. Preferred materials for the fabrication of the dendritic elements 77 are metals or combinations, composites or alloys of metals selected from the group palladium, nickel, gold, platinum, rhodium, ruthenium, irridium and osmium. The electroplating of such dendritic elements may, for example, be accomplished by the method as defined in Canadian Patent No. 1,121,011, which patent is incorporated herein by reference. The metal palladium has proven to provide a particularly favorable combination of electrical, mechanical and chemical properties (high electrical conductivity, ductility, yield strength and corrosion resistance) for the function of such elements when electroplated at a temperature near 30 degrees Celsius (C) at a current density near 60 milliamperes per square centimeter from an aqueous ammonia bath containing 15 millimolar palladium tetrammine chloride and 5 molar ammonium chloride, adjusted to a pH of 9 to 9.2. Preferably, these elements are then overplated for an additional time at a current density of 10 milliamperes per square centimeter in a bath of the same composition given above, except that the concentration of palladium is 150 millimolar. Significantly, this overplating with palladium metal is used to strengthen the dendritic elements. During both of these electroplating processes, the anodes should preferably be larger than opening 71 and placed perpendicular to the axis of said opening at a distance from said opening which is larger than the length and width of the said opening.

Examples of such anodes (and placement) are shown in FIG. 8 and represented by the numerals 78. In one embodiment, anode 78 is of a thick screen-like construction and of a material such as titanium, niobium, or tantalum plated with platinum. To further enhance the electroplating process, agitation of the plating solution by means such as ultrasonic techniques and/or movement of the part being plated by mechanical means may be utilized. Such placement will result in the dendritic elements 77 growing on the conducting layer 75 predominantly in a direction perpendicular to said conducting layer and lying in the plane of said opening, as seen in FIGS. 9 and 10. Such orientation is particularly desired to provide enhanced connection between these elements and conductors (e.g., pads 31).

FIG. 10 shows a conductive end portion after a portion of dielectric layer 19 and conductive elements 41 and 45 are removed, preferably by punching away undesired material. That is, the upper portion of the flexible circuit member's end (above part of the dendritic elements and conducting layer) is removed, such that some of these dendrites will remain, as seen in FIG. 10.

Significantly, penetrating-type contact geometries such as dendritic elements 77 are included on the end portions of the flexible circuit member's contact interfaces to enhance the reliability of the connections by offering contact redundance, which in turn reduces contact resistance, heat dissipation, and the temperature in the contacts during operation. Furthermore, dendritic elements 77 can break through dust, films, and fibrous debris that may be present on such conductive pads 31 as those shown for circuit members 33 and 35.

Thus there has been shown and described an electrical connector for providing highly dense interconnections between corresponding pluralities of conductive elements on opposing pairs of circuit members. Such connections are obtainable in a facile manner using the invention, which is of relatively simple construction and thus relatively inexpensive to manufacture and operate. It is understood from the foregoing that the described connections are readily separable such that the connector can be removed and repositioned, if necessary. Such a capability enables testing of the respective circuits on the described circuit members, if desired, in an overall connector scheme.

While there have been shown and described what are at present considered the preferred embodiments of the invention, it will be obvious to those skilled in the art that various changes and modifications may be made therein without departing from the scope of the invention as defined by the appended claims.

What is claimed is:

1. A connector for electrically interconnecting first and second electrical circuit members, said connector comprising:
    a housing adapted for being positioned substantially between said first and second electrical circuit members;
    at least one elongated flexible circuit member located within said housing and including a dielectric layer and at least one conductive element having first and second conductive end portions adapted for engaging said first and second circuit members, respectively when said housing is positioned substantially between said first and second electrical circuit members; and
    spring means operatively connected to said flexible circuit member for exerting a predetermined force against said flexible circuit member to cause said first and second conductive end portions of said conductive element to engage said first and second circuit members, said spring means attached to said flexible circuit member at spaced locations on said flexible circuit member and having a shape substantially conforming to the portion of said flexible circuit member between said spaced locations.

2. The connector according to claim 1 wherein said conductive element is comprised substantially of copper.

3. The connector according to claim 1 wherein said housing is electrically insulative.

4. The connector according to claim 3 wherein said housing is plastic.

5. The connector according to claim 1 wherein said elongated flexible circuit includes a plurality of said conductive elements spacedly positioned thereon.

6. The connector according to claim 5 wherein said conductive end portions of said conductive elements are of substantially similar width.

7. The connector according to claim 6 wherein said conductive end portions of said conductive elements are of substantially similar thickness.

8. The connector according to claim 1 wherein each of said conductive end portions comprises a plurality of dendrites.

9. The connector according to claim 8 wherein said dendrites are comprised of palladium.

10. The connector according to claim 1 wherein said dielectric layer is comprised of polymer material.

11. The connector according to claim 10 wherein said polymer material is polyimide.

12. The connector according to claim 1 wherein said housing includes first and second parts.

13. The connector according to claim 12 wherein said housing includes means for retaining said flexible circuit member in an aligned manner.

14. The connector according to claim 13 wherein said means for retaining said flexible circuit member comprises at least two ribs, said ribs being located within at least one of said parts of said housing.

15. The connector according to claim 14 wherein said ribs define a slot therebetween, said flexible circuit member being located within said slot.

16. The connector according to claim 1 wherein said spring means is metallic.

17. The connector according to claim 16 wherein said spring means is comprised of steel.

18. The connector according to claim 1 wherein said spring means includes a tensile strength substantially greater than the tensile strength of said conductive element.

19. The connector according to claim 18 wherein said tensile strength of said spring means is at least twice said tensile strength of said conductive element.

20. The connector according to claim 1 wherein said spring means and said flexible circuit member define a first space therebetween prior to engagement between said first and second conductive end portions of said flexible circuit member and said first and second circuit members and a second, narrower space therebetween during said engagement.

21. The connector according to claim 20 wherein said spring means and said flexible circuit member include a curved portion, said first and second spaces being located substantially between said curved portions.

22. A connector for electrically interconnecting first and second electrical circuit members, said connector comprising:
a housing adapted for being positioned substantially between said first and second electrical circuit members; and
at least one elongated, compressible contact member located within said housing in physical contact therewith and including first and second conductive end portions for engaging said first and second electrical circuit members in a penetrating manner, when said housing is positioned substantially between said first and second electrical circuit members, said contact member adapted for occupying a first position while in a prestressed condition caused by said physical contact with said housing and having a first predetermined shape within said housing prior to said engagement between said first and second conductive end portions and said first and second electrical circuit members and thereafter occupying a second position while in a compressed condition and having a second predetermined shape different from said first predetermined shape within said housing during said engagement.

23. The connector according to claim 22 wherein said housing is adapted for occupying first and second locations between said first and second electrical circuit members, said housing occupying said first location prior to said engagement of said first and second electrical circuit members by said first and second conductive end portions and moving to said second location during said engagement.

24. The connector according to claim 23 wherein said housing includes at least one positioning member, said elongated, compressible contact member slidably engaging said positioning member during said engagement between said first and second conductive end portions and said first and second electrical circuit members.

25. The connector according to claim 24 wherein said positioning member is electrically insulative.

26. The connector according to claim 24 wherein said positioning member includes at least one curved surface, said contact member slidably engaging said curved surface.

27. The connector according to claim 26, wherein said curved surface of said positioning member is substantially concave.

28. The connector according to claim 23 wherein said housing includes alignment means, said housing adapted for moving within said alignment means to occupy said first and second locations.

29. The connector according to claim 28 further including biasing means for biasing said housing in the direction of said second location within said alignment means.

30. The connector according to claim 29 wherein said biasing means comprises at least one spring.

31. The connector according to claim 22 wherein said housing is electrically insulative.

32. The connector according to claim 31 wherein said housing is plastic.

33. The connector according to claim 22 wherein said compressible contact member comprises a flexible circuit member and a spring means operatively connected thereto for exerting a predetermined force against said flexible circuit member to cause said first and second conductive end portions to engage said first and second circuit members, respectively.

34. The connector according to claim 33 wherein said spring means is attached to said flexible circuit member at spaced locations and includes a shape substantially conforming to the portion of said flexible circuit member between said spaced locations, said spring means and said flexible circuit member defining a first space therebetween prior to engagement between said first and second conductive end portions of said flexible circuit member and said first and second circuit members and a second, narrower space therebetween during said engagement.

35. The connector according to claim 33 wherein said elongated flexible circuit member includes a plurality of conductive elements spacedly positioned thereon.

36. The connector according to claim 35 wherein said conductive elements include said conductive end portions thereon, said conductive elements being of substantially similar width.

37. The connector according to claim 35, wherein said conductive elements include said conductive end portions thereon, said conductive elements being of substantially similar thickness.

38. The connector according to claim 35 wherein said conductive elements are copper.

39. The connector according to claim 33 wherein said flexible circuit member includes a dielectric layer.

40. The connector according to claim 39 wherein said dielectric material is comprised of polymer material.

41. The connector according to claim 40 wherein said polymer material is polyimide.

42. The connector according to claim 33 wherein said spring means is metallic.

43. The connector according to claim 42 wherein said spring means is comprised of steel.

44. The connector according to claim 42 wherein said spring means includes a tensile strength substantially greater than the tensile strength of said conductive element.

45. The connector according to claim 43 wherein said tensile strength of said spring means is at least twice said tensile strength of said conductive element.

46. The connector according to claim 22 wherein each of said conductive end portions comprises a plurality of dendrites.

47. The connector according to claim 46 wherein said dendrites are comprised of palladium.

* * * * *